United States Patent
Kiiskilä et al.

(10) Patent No.: US 11,879,922 B2
(45) Date of Patent: Jan. 23, 2024

(54) ARRANGEMENT AND METHOD FOR TESTING A 4.5G OR A 5G BASE STATION

(71) Applicant: Orbis Systems Oy, Oulu (FI)

(72) Inventors: Mika Kiiskilä, Oulu (FI); Tuomo Tolonen, Oulu (FI); Matti Tervo, Oulu (FI)

(73) Assignee: Orbis Systems Oy, Oulu (FI)

( * ) Notice: Subject to any disclaimer, the term of this patent is extended or adjusted under 35 U.S.C. 154(b) by 456 days.

(21) Appl. No.: 17/284,251

(22) PCT Filed: Oct. 3, 2019

(86) PCT No.: PCT/FI2019/050709
§ 371 (c)(1),
(2) Date: Apr. 9, 2021

(87) PCT Pub. No.: WO2020/074772
PCT Pub. Date: Apr. 16, 2020

(65) Prior Publication Data
US 2021/0373060 A1    Dec. 2, 2021

(30) Foreign Application Priority Data
Oct. 12, 2018 (FI) .................. 20185860

(51) Int. Cl.
*G01R 29/08* (2006.01)
*G01R 29/10* (2006.01)
(Continued)

(52) U.S. Cl.
CPC ....... *G01R 29/0878* (2013.01); *G01R 29/105* (2013.01); *H01Q 3/267* (2013.01); *H01Q 21/062* (2013.01); *H04B 5/0043* (2013.01)

(58) Field of Classification Search
None
See application file for complete search history.

(56) References Cited

U.S. PATENT DOCUMENTS

| | | | |
|---|---|---|---|
| 4,700,197 A * | 10/1987 | Milne | H01Q 3/446 343/837 |
| 6,842,157 B2 | 1/2005 | Phelan et al. | |
| 2003/0076274 A1 | 4/2003 | Phelan et al. | |
| 2011/0084887 A1* | 4/2011 | Mow | G01R 29/10 343/703 |

(Continued)

FOREIGN PATENT DOCUMENTS

| | | |
|---|---|---|
| EP | 1227545 A1 | 7/2002 |
| EP | 3312619 A1 | 4/2018 |
| FR | 2860344 A1 | 4/2005 |

OTHER PUBLICATIONS

Rohde & Schwarz, "Millimeter-Wave Beamforming: Antenna Array Design Choices & Characterization," White Paper, retrieved on Aug. 17, 2022 from http://www.rohde-schwarz.com/us/applications/millimeter-wave-beamfroming-antenna-array-design-choices-characterization-white-paper_230854-325249.html, 2016, 28 pages.

(Continued)

*Primary Examiner* — A B Salam Alkassim, Jr.
*Assistant Examiner* — Anh N Ho
(74) *Attorney, Agent, or Firm* — Meunier Carlin & Curfman LLC

(57) ABSTRACT

The present invention discloses an antenna arrangement for 4.5G or 5G base station testing purposes. The antenna elements are placed in concentric rings and in a star-shaped arrangement around a center spot. All antenna elements within the same ring are controlled by the same amplitude and phase control signal. The test system processor also selects dedicated rings into use and switches the rest of the rings off. The ring spacing, i.e. the mutual antenna element distance along the same radial line will be determined based on highest frequency within the desired wide frequency band. A bowtie dipole type of antenna can be used. The antenna elements can be fixed on a printed circuit board, and thus, they remain mechanically stationary.

15 Claims, 4 Drawing Sheets

(51) Int. Cl.
*H01Q 3/26* (2006.01)
*H01Q 21/06* (2006.01)
*H04B 5/00* (2006.01)

(56) References Cited

U.S. PATENT DOCUMENTS

| | | | |
|---|---|---|---|
| 2013/0059545 A1* | 3/2013 | Kyosti | H04B 17/391 455/67.12 |
| 2014/0091961 A1 | 4/2014 | Foegelle | |
| 2018/0102591 A1* | 4/2018 | Rowell | H01Q 21/061 |
| 2018/0102859 A1* | 4/2018 | Rowell | H04B 7/0615 |
| 2019/0356397 A1* | 11/2019 | DaSilva | H04B 17/17 |

OTHER PUBLICATIONS

International Search Report and Written Opinion for International Application No. PCT/FI2019/050709 dated Apr. 2, 2020.

Lemaitre-Auger et al., "Circular antenna arrays for near-field focused or multi-focused beams", Electromagnetic Theory (EMTS), Proceedings of 2013 URSI International Symposium On, IEEE, May 20, 2013, pp. 425-428.

Nepa, "Near-Field Focused Antennas for Wireless Communications and Power Transfer", Dept. of Information Engineering, University of Pisa, Apr. 18-20, 2016, Bologna, Italy, 49 pages.

Siragusa et al., "Tunable near-field focused circular phase-array antenna for 5.8-GHz RFID applications", IEEE Antennas and Wire-less Propagation Letters, 2011.

Search Report for Finnish Application No. 20185860 dated Apr. 16, 2019.

EPO, Notice of Opposition dated Aug. 18, 2023 (OP103357EP).

Yunita, Meutia, Analysis of Vivaldi, Rectangular, Bow-tie, and Quasi-Yagi Antenna Performance for S-Band FMCW-SAR on UAV Platform, UNSYS Digital, Journal of Unmanned System Technology, Feb. 2018.

* cited by examiner

| # Rings | Mean Amp Error dB | Mean Ph Error deg | Mean Amp Error (Q) dB | Mean Ph Error (Q) deg | Max Amp Error dB | Max Ph Error deg | Max Amp Error (Q) dB | Max Ph Error (Q) deg | Antenna Config |
|---|---|---|---|---|---|---|---|---|---|
| 1 | -13.58 | -62.97 | -19.17 | -62.97 | -92.32 | -184.0 | -92.46 | -184.0 | 7 |
| 2 | -3.399 | -31.92 | -8.348 | -31.79 | -69.62 | -160.6 | -59.28 | -160.6 | 67 |
| 3 | -2.019 | -17.92 | -6.203 | -18.36 | -20.57 | -65.49 | -20.59 | -65.68 | 378 |
| 4 | -0.926 | -15.25 | -3.520 | -15.32 | -8.148 | -61.95 | -8.110 | -64.03 | 2789 |
| 5 | -1.385 | -16.80 | -5.174 | -16.71 | -11.35 | -64.94 | -11.91 | -62.61 | 24567 |
| 6 | -0.692 | -14.42 | -4.715 | -24.37 | -8.717 | -59.53 | -9.323 | -74.18 | 124579 |
| 7 | -0.565 | -14.33 | -1.994 | -17.35 | -7.680 | -51.77 | -7.219 | -67.30 | 23456910 |
| 8 | -0.632 | -15.37 | -2.753 | -19.84 | -7.271 | -53.72 | -9.324 | -64.12 | 12456789 |
| 9 | -0.462 | -16.00 | -2.399 | -30.98 | -7.084 | -52.33 | -9.039 | -82.34 | 12345679 10 |
| 10 | -0.441 | -16.52 | -2.378 | -25.37 | -7.200 | -57.22 | -9.231 | -85.50 | 12345678910 |

Figure 4

ARRANGEMENT AND METHOD FOR TESTING A 4.5G OR A 5G BASE STATION

CROSS-REFERENCE TO RELATED APPLICATIONS

This application is a national stage application filed under 35 U.S.C. § 371 of PCT/FI2019/050709 filed Oct. 3, 2019, which claims priority to and benefit of Finnish patent application serial number 20185860, filed Oct. 12, 2018, the contents of which are incorporated herein by reference in their entirety.

FIELD OF THE INVENTION

The present invention relates to testing 4.5G or 5G base stations and antenna systems applicable in such base stations.

BACKGROUND OF THE INVENTION

Measurements and testing of a 4.5G or a 5G base station are commonly and currently performed as far-field measurements over the air interface with appropriate receiving antennas. Such an antenna setup and a formation of a proper far-field signal in the transmitted base station signal requires large dimensions which make the applicability of the whole TX and RX antenna system costwise and sizewise too large. Typically a far-field signal measurement distance is about at least 5-10 meters $$\left(d_F = \frac{2D^2}{\lambda}\right)$$

which is too much for indoor-based measurements. If the measurement antenna locates too close to the TX/RX antenna array (i.e. the base station), there will occur too much phase and amplitude ripple degrading the TX and RX measurement results.

It is a problem in the measurements of active antennas that near field to far field transformation methods are not applicable with such antennas.

There are some compact range techniques and measurements for antenna measurements but the problem of them is the expensiveness of these techniques, with the fact that they require at least a moderate amount of space for successful measurements.

Publication US 2018/0102591 ("Rowell 1") discloses an antenna array, a test system and method for testing a device under test. The system generates and/or receives a plane wave and the antennas are movable with respect to one another, in other words, displaced in a mechanical manner. This is preferably performed in two directions among the X-, Y- or Z-directions. The measurement can be performed as a near-field measurement. There can be two layers of antennas in two different planes where the first group of antennas may be waveguide antennas and the second group is formed by dipole antennas. Antenna movement path in circular, spiral and helical manners are also mentioned in addition to linear movement.

Publication US 2018/0102859 ("Rowell 2") discloses an antenna array and a test system and method for testing a device, where antenna elements are grouped in at least two antenna groups, and these groups are arranged symmetrically to the array's center point. As FIG. 1 points out, the symmetry can be a rotational symmetry in each antenna group, meaning ring-shaped antenna groups around the center spot of the array.

Auger et al.: "Circular Antenna Arrays for Near-Field Focused or Multi-Focused Beams", Proceedings of the "2013 International Symposium on Electromagnetic Theory" discloses circular antenna arrays where patch antenna elements are used in a hexagonal lattice, square lattice or polar lattice, where the polar lattice is mentioned as requiring the simplest feeding network design. Because the distance from a circular group of elements to the center is the same for polar lattice design, their phase is the same. Therefore, for n pieces of circles, there is required "n−1" pieces of phase shifters in the feeding network, as shown in the schematic representation of FIG. 3. Near field focusing can be performed in order to focus the antenna array signals so that the received RF power increases in the near field. Application areas include RFID applications where required propagation distances are short but required power is rather large within the short distance. The control method of the antenna elements seems to be similar with the above publication of "Rowell 2".

Document P. Nepa: "Near-Field Focused Antennas for Wireless Communications and Power Transfer", Dept. of Information Engineering, Univ. of Pisa, Italy, April 2016 discloses various antennas where near-field focus is obtained. Certain antenna designs and advanced synthesis techniques are discussed. In page 36, circular arrays with three circular rows for focus scan have been illustrated and there is a reference to R. Siragusa, P. Lemaitre-Auger, S. Tedjini: "Tunable near-field focused circular phase-array antenna for 5.8-GHz RFID applications", IEEE Antennas and Wireless Propagation Letters, 2011, which discloses a circular phase-array antenna at 5.8 GHz for RFID use. The antenna design consists of 24 halfwave-length dipole antennas places on three circles (eight printed dipoles per row). Two phase-shifters are used and a tunable focal spot in the range of 0.4-1 m is obtained. All circles are tuned and used, and the application area is indeed in the RFID technology.

Prior art also uses antenna arrays in matrix-like lines and rows in a rectangular planar arrangement. Also an even more complex prior art solution is to use a specific antenna array matrix for each used frequency where a switch or corresponding means can be used to pick up the correct optimized matrix-type of antenna array into use. The first one is an expensive solution, and the latter one is both expensive and complex and it requires a lot of space for the full arrangement.

The problem in prior art is that current solutions require mechanical movement of antenna elements within the antenna array. The physical movements lead to wear and tear of elements which may lead to malfunction or at least more maintenance is required for such elements. This makes the system more expensive as well.

Current antenna elements in the antenna array are also not easily implementable on a single circuit board because the antenna elements need to be movable.

SUMMARY OF THE INVENTION

The present invention introduces an antenna arrangement and a method for using the antenna arrangement in 4.5G or 5G base station testing in TX and RX measurements. A main purpose is to perform these tests in much smaller dimensions and shorter spaces than the actual use situation mainly in outdoors conditions. The invention creates far-field conditions in much shorter distances than in conventional art.

Plane wave synthesis is applied for the created antenna and thus, also plane wave synthesis method, and a respective plane wave generator (PWG) are discussed. The plane wave synthesis is used here when generally describing the used method. The PWG is a device, which creates a plane wave to a near field. Furthermore, there is discussion in design methods of the PWG which can also be called as PWG synthesis procedures. This means in practice the planning, physical assembly and possible fine-tuning of the antenna element positions, active selection and selective controlling of the antenna elements in the antenna array during use, and verifying the results which leads to a decision if the results are satisfactory. The PWG synthesis procedure can thus comprise an iterative process of building an antenna assembly, and finding a satisfactory design through trying, verifying and redesigning the physical assembly with their control signals. The antenna array and the other related elements in the arrangement according to the invention is thus part of the PWG or a PWG system. The test system and the antenna array are part of the inventive concept. In the following, where a method is disclosed it relates generally to plane wave synthesis but in an unintroduced fashion. The devices of the system, or other parts of the system can also be said to be part of a PWG system.

In order to reduce complexity within regular antenna systems where each and every antenna element is fed with own, accurate amplitude and phase adjustments, the antennas are formed in antenna groups. In other words, the whole antenna arrangement is divided into sub-arrays with amplitude and phase adjustments specific with each antenna sub-array. The shape of the antenna array can be selected and the antenna elements are placed in rings of different radius. Each ring forms a sub-array having same weighting parameters for each individual element. Now different weighting parameters were only needed for each ring sub-array. Complexity and cost are reduced by such sub-array grouping, when comparing to the regular prior art antenna systems.

The present disclosure is based, at least in part, in the following findings:
  spaces between the antennas of the array correspond to the frequency of the plane wave
  Bigger quiet zone (plane wave area) needs bigger antenna matrix
  Optimal performance is not always achieved when all antenna rings are on
  Number of the antenna rings can be reduced quite much without significant performance degradation (see FIG. 4: four rings obtain almost as good result as seven rings)

Regarding antenna distances inside each circular ring, a good result is obtained by placing rings in $\lambda/2$ ring spacing at the tuned frequency and less than one wavelength at the highest frequency.

Still, a wideband antenna is obtainable around the tuned frequency which works still sufficiently well with even 1.7 GHz . . . 6 GHz frequency range. By increasing the number of antenna rings, the results in the antenna operation improve, but the optimal functionality does not require all antenna rings to be on. Instead, the processor may determine which antenna rings give a sufficiently good or optimal result for the antenna's operability for each operating frequency, and it then switches these antenna rings on with proper amplitude and phase control signals for each ring, i.e. sub-array.

Finally, there might be antenna rings which are not needed at all after optimization. This gives opportunity to simplify design and reduce costs by removing additional rings totally.

It is also possible to place other antenna rings to empty slots which have different operating frequency and extend the antenna array operating frequency range beyond the individual antenna element operating frequency.

Good wideband results can be obtained by using e.g. quite small (like around 3 cm in length) bowtie dipole antenna elements and placing them with around 0.75*$\lambda$ ring spacing at the highest used frequency, which is in this example 6 GHz. Of course the invention may use other antenna element designs than merely bowtie dipoles. Also the size of a single antenna can be different than above, and the size can be bigger especially with lower operating frequencies than 6 GHz. Generally, the number of antenna rings of the antenna array can be determined from the maximum frequency and size of the wideband DUT (i.e. device under test) antenna, and the antenna elements are placeable side-by-side without any physical overlapping within a planar antenna array structure. If the needed frequency range is higher for the wideband antenna, it generally means that the ring spacing needs to be smaller and the number of antenna rings needs to be higher, resulting also in increasing number of single antenna elements.

In an embodiment, there are gaps between the antenna elements, which can be filled with RF absorbing material, to get rid of possible reflections occurring within the arrangement.

In an embodiment, the antenna array can be placed on a single printed circuit board. In another embodiment, the weighting network can be integrated onto the printed circuit board as well. In more detail with the height tuning possibility, the whole antenna arrangement is integrated on a single printed circuit board, with height tuning means for the desired antenna elements.

In an embodiment, during assembly of the antenna elements, the invention comprises the possibility to tune the placement of the individual antennas in depth direction. This means for a single antenna element that the height of an antenna element in relation to the plane of the antenna (i.e. the antenna arrangement) comprising the other antenna elements can be tuned e.g. with screw(s) during the assembly of the antenna arrangement. In case all the antenna elements are integrated within a single circuit board, or if a single ring of antenna elements are integrated within a single circuit board, then the planarly form of the whole circuit board can be transformed e.g. with screws to result in a non-planar assembly of the antenna elements. By this way, the phase tolerances of the input network and the manufacturing tolerances of the antenna element can be compensated.

In an embodiment, the presented antenna array can be used for both downlink and uplink measurements in 4.5G or 5G networks.

As a result, the above method generates plane wave conditions in the so-called quiet zone volume with tunable amplitude and balance performance. The plane wave characteristics are good even in the distance of 1.5 meters from the TX antenna array.

As a summary, according to a first aspect of the invention, it introduces an arrangement applicable to 4.5G or 5G base station testing, wherein the arrangement comprises
  an antenna arrangement (10, 32) comprising a plurality of antenna elements (11-15, 20, 33) in a planar arrangement or close to a planar arrangement where a height of an antenna element (11-15, 20, 33) can be individually tuned in view of other antenna elements, a test system processor (30) controlling the amplitude and phase of the plurality of antenna elements (11-15, 20, 33), and the plurality of antenna elements (11-15, 20, 33) are placed in substantially symmetrical fashion in view of a center spot of the antenna arrangement or in view to a center line splitting the antenna arrangement in half.

The arrangement is characterized in that—the test system processor (30) is configured to divide the plurality of the antenna elements (11-15, 20, 33) into subarrays, where the sub-arrays locate in bands surrounding one another with a substantially mutual center spot, the antenna elements (11-15, 20, 33) in a single subarray forming a substantially symmetrical arrangement in view of a center spot or a center line, wherein the test system processor (30) is configured to control all antenna elements (11-15, 20, 33) in the same sub-array with a predetermined amplitude and phase, and the test system processor (30) is configured to switch on and control dedicated sub-arrays among the whole antenna arrangement, and to switch the rest of the sub-arrays off, applied in a predetermined use frequency, enabling reswitching of the sub-arrays on or off in a given time instant during wideband testing of a 4.5G or 5G base station.

In an embodiment, the antenna arrangement is configured to be formed in a star-shaped arrangement, comprising direct radial branches of antenna elements (11-15, 20, 33).

In an embodiment, the antenna arrangement comprises eight, four or sixteen radial branches of antenna elements (11-15, 20, 33) in view of the center spot of the antenna arrangement.

In an embodiment, the antenna elements (11-15, 20, 33) are all of a same antenna type.

In an embodiment, the antenna type is a bowtie dipole with its length less than 10 cm.

In an embodiment, the antenna type is selected from a group of a regular dipole antenna, patch antenna, yagi antenna, a Vivaldi antenna, and a broadband monopole.

In an embodiment, each sub-array locates in a substantially ring-shaped area with a predetermined radius around the center spot.

In an embodiment, a sub-array is a band of area with a square shape.

In an embodiment, a sub-array is a band of area with an elliptical shape.

In an embodiment, the whole antenna arrangement is integrated on a single printed circuit board, with height tuning means for the desired antenna elements (11-15, 20, 33).

In an embodiment, amplitude and phase adjustment elements for each antenna ring and their antenna elements (11-15, 20, 33) are fixed and integrated on the same printed circuit board as the whole antenna arrangement.

In an embodiment, the arrangement comprises RF absorbing material in gaps between the antenna elements (11-15, 20, 33) either fully or partially.

In an embodiment, all antenna elements (11-15, 20, 33) are configured to remain mechanically stationary during usage of the arrangement in wideband 4.5G or 5G base station testing after the height tunings have been made for the antenna elements (11-15, 20, 33).

In an embodiment, phase tolerances of an input network and manufacturing tolerances of the antenna elements (11-15, 20, 33) are configured to be compensated by tuning the heights of desired antenna elements (11-15, 20, 33) in relation to the plane of the antenna arrangement (10, 32) or in relation to heights of the other antenna elements (11-15, 20, 33) with at least one screw as the height tuning means between the respective antenna element (11-15, 20, 33) and the printed circuit board during the assembly of the antenna arrangement (10, 32).

According to a second aspect of the invention, it introduces a method applicable to 4.5G or 5G base station testing, wherein the method comprises the steps of arranging planarly or close to a planar arrangement a plurality of antenna elements (11-15, 20, 33) into an antenna arrangement (10, 32) where a height of an antenna element (11-15, 20, 33) can be individually tuned in view of other antenna elements, controlling the amplitude and phase of the plurality of antenna elements (11-15, 20, 33) by a test system processor (30), and placing the plurality of antenna elements (11-15, 20, 33) in substantially symmetrical fashion in view of a center spot of the antenna arrangement or in view to a center line splitting the antenna arrangement in half.

The method is characterized in that the method further comprises the steps of dividing, by the test system processor (30), the plurality of the antenna elements (11-15, 20, 33) into sub-arrays, where the sub-arrays locate in bands surrounding one another with a substantially mutual center spot, the antenna elements (11-15, 20, 33) in a single sub-array forming a substantially symmetrical arrangement in view of a center spot or a center line, wherein controlling, by the test system processor (30), all antenna elements (11-15, 20, 33) in the same sub-array with a predetermined amplitude and phase, and switching on and controlling, by the test system processor (30), dedicated subarrays among the whole antenna arrangement, and switching the rest of the subarrays off, applied in a predetermined use frequency, enabling reswitching of the sub-arrays on or off in a given time instant during wideband testing of a 4.5G or 5G base station.

BRIEF DESCRIPTION OF THE DRAWINGS

FIG. 4 illustrates a simulation result table for 6.0 GHz with different numbers of used antenna rings applying a circular ring antenna array structure with bowtie dipoles in a star-shaped form.

DETAILED DESCRIPTION OF THE INVENTION

The present invention introduces a receiving antenna arrangement for testing a 4.5G or a 5G base station in an efficient manner and according to the relevant requirements. A main principle in the present invention is that the antenna elements within the antenna array do not need to be mechanically moved; instead, the antenna elements are electrically controlled and placed in a fixed position. As a second key feature of the invented antenna array and corresponding control method, the antennas are placed in circular, ring-shaped arrangement around a center spot, i.e. in concentric rings.

Figure 1:
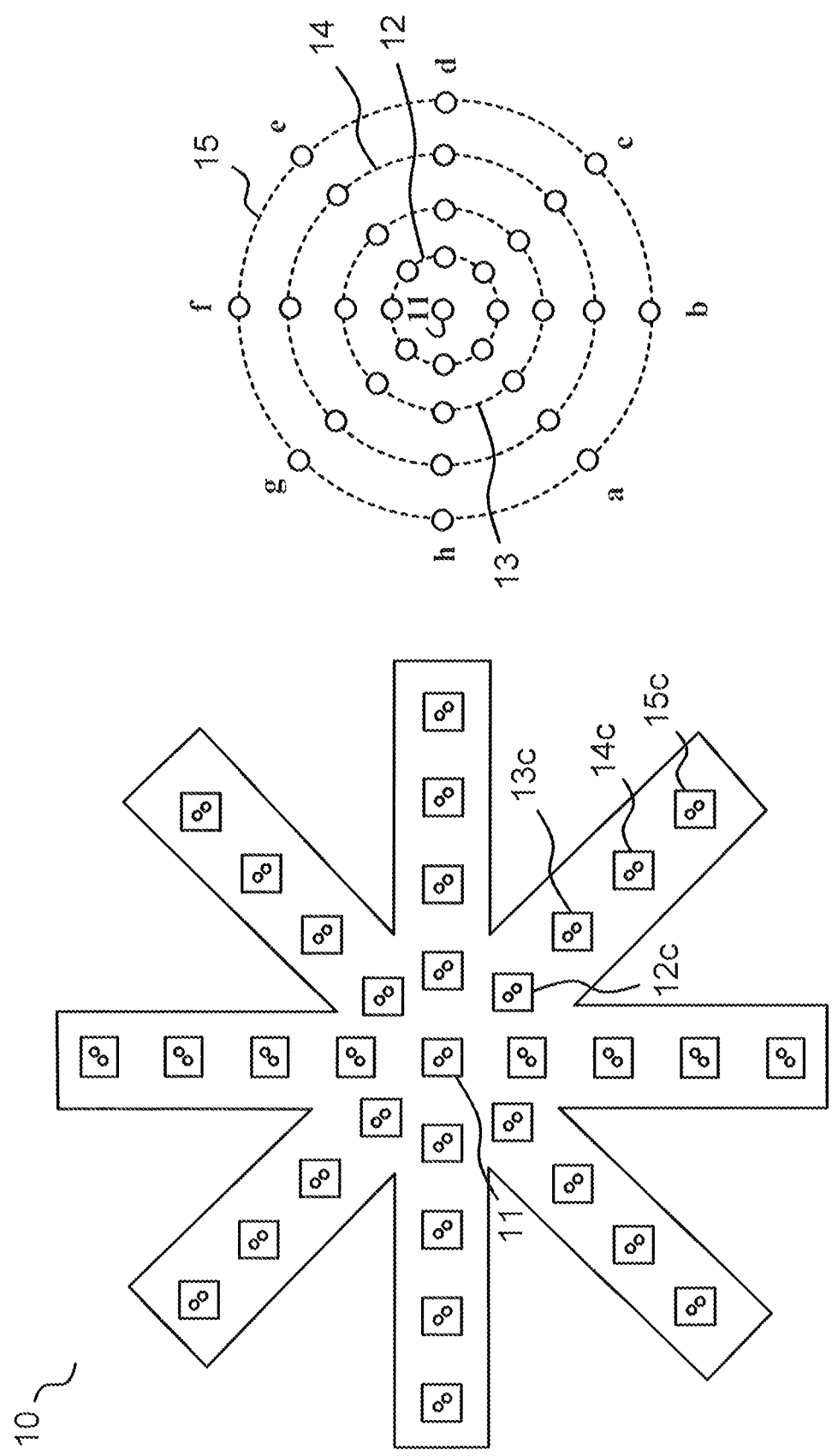
FIG. 1 illustrates an example of a star-shaped and circular ring shaped antenna array with five rings.

FIG. 1 illustrates an embodiment of the present invention where a circularly and radially shaped planar RX antenna array 10 is shown. In the array, there is a central antenna element 11, and in this example four circular antenna element groups 12-15, where each circular ring of antenna elements comprises eight elements, marked here as elements a-h. The ring with the shortest radius thus comprises antenna elements 12a-h and with the highest radius, the outermost ring comprises antenna elements 15a-h. The antenna array in this example comprises 33 pieces of antenna elements. The antenna array 10 and its antenna elements all may locate on a single plane (i.e. in a planar arrangement) and thus, it is possible to fix and integrate them on a single planar circuit board. However, it is also possible that an antenna arrangement comprises a plurality of antenna elements in close to a planar arrangement where a height of an antenna element can be individually tuned in view of other antenna elements. The height means a deviation in an orthogonal direction from the main plane of the antenna elements. Still, all or just a part of the antenna element can be tuned regarding their height. This definition has no effect on the possible different alignments of the antenna arrangement. The height tuning can be performed with at least screw in a manually tunable fashion. The effect of the height tuning is that phase tolerances of an input network and manufacturing tolerances of the antenna elements are compensated this way.

Figure 2:
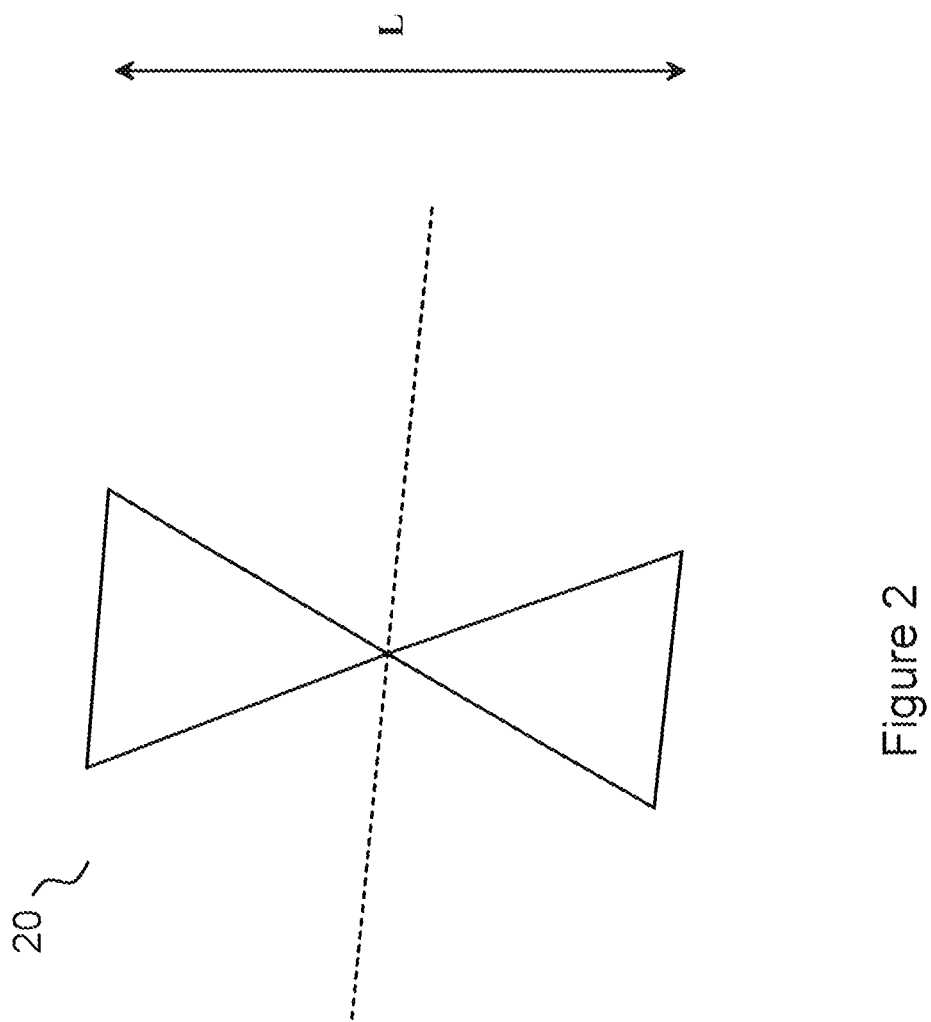
FIG. 2 illustrates an antenna example of a bowtie dipole design.

A single antenna element is preferably relatively small in size. In an embodiment, the chosen antenna element for the array can be a bowtie dipole antenna. In a further embodiment, the length L of the bowtie dipole can be selected between 2.0-4.0 cm. Such an antenna design structure for a single bowtie dipole element 20 is shown in FIG. 2 where the length of the bowtie dipole element 20 is L.

The distances between adjacent antennas can be selected depending on the used frequency. In a useful embodiment for the 4.5G or the 5G base station testing, the mutual distance can be in the range of 2-10 centimeters. In a specific exemplary value, the mutual distance between antennas can be 4.0 cm.

The number of used circular antenna rings depends on the used frequency and DUT size as well. Just for presenting an example, ten circular rings of antenna elements is a well applicable number for frequency ranges used specifically in 4.5G or 5G base station testing, which comprise the frequencies 1.7 GHz, 3.0 GHz and 6.0 GHz in the examples presented here.

When the mutual distances between adjacent antennas and the individual antenna types (designs) have been preselected and implemented when manufacturing the antenna assembly with a given number of antenna rings, the same antenna array can be used for various different frequency areas. This is enabled by the electrical tuning of the antenna elements where given antenna rings are selected to be used in the antenna array, and the rest of the rings are switched off temporarily. If the frequency is changed, the selection of the circular antenna rings is reperformed, and as a result, the used antenna rings may change in order to obtain an optimal receiving performance in the 4.5G or the 5G base station testing.

Figure 3:
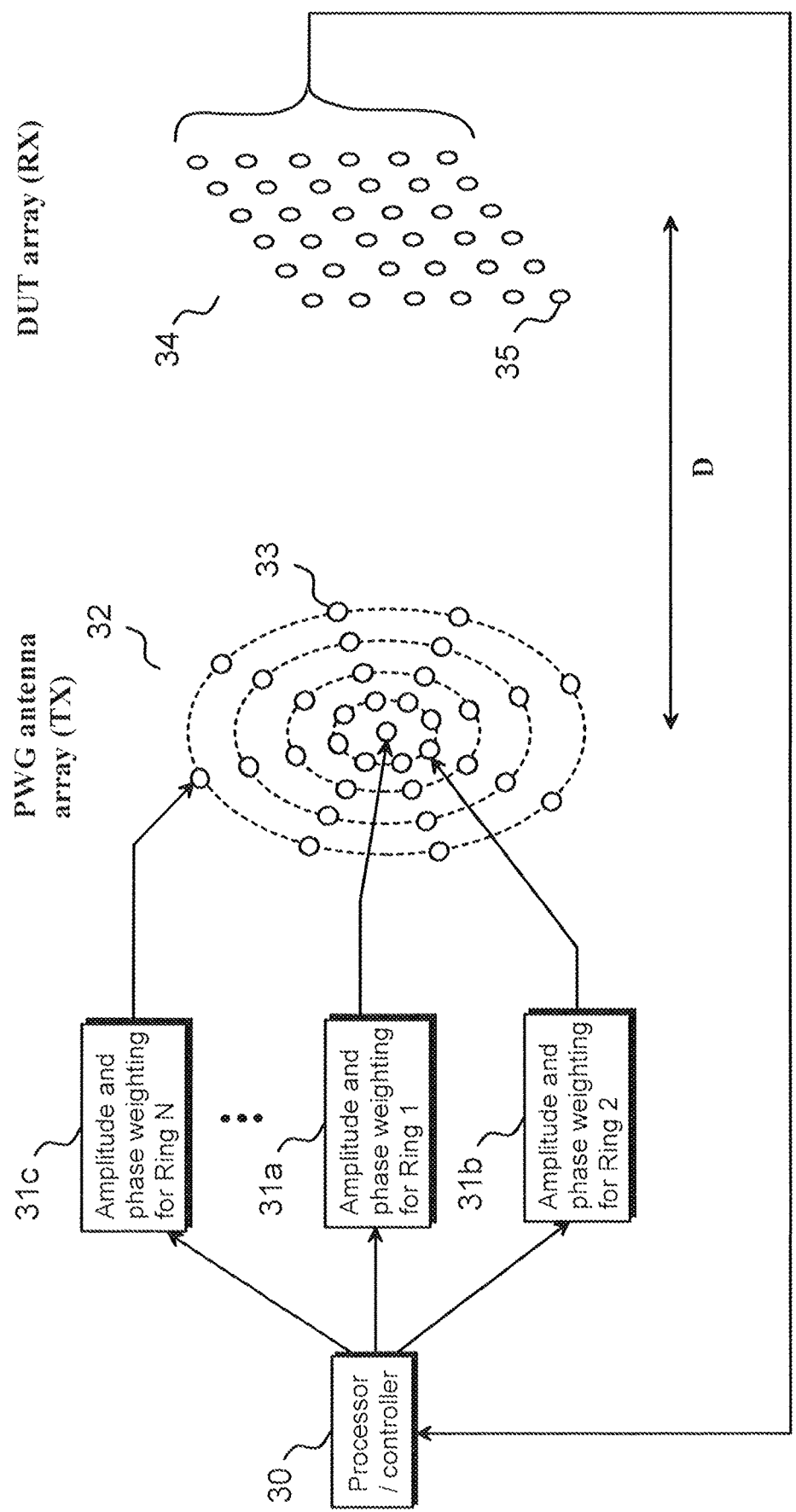
FIG. 3 illustrates a plane wave synthesis test system as a block diagram in an embodiment of the invention.

The basic principle behind selecting optimal circular antenna rings is to simulate the system by picking predetermined rings and their antenna elements for generating i.e. synthesizing a plane wave with a TX antenna array. In other words, this is an action called plane wave synthesis, and the transmitting antenna arrangement in the testing can be called an antenna array of the PWG. Such a PWG test system as a block diagram is illustrated in FIG. 3. In that exemplary arrangement the transmitting antenna array 32 creating a plane wave in the test environment is the antenna array 32 locating on a vertically aligned plane. It comprises a star-shaped design where there are five circular rings, and eight antenna elements 33 in each ring except the innermost ring. The innermost ring is formed by a single antenna element, and it also forms the center spot within the TX antenna array 32 in this embodiment. The innermost ring with a single antenna element is also called as "Ring 1" in the context of FIG. 3, the next ring with eight antenna elements 33 is called as "Ring 2", and the outermost ring is here called as "Ring N", with N=5 in the situation of the illustrated example. The test system comprises a test system processor or controller 30. It gives control signals to amplitude and phase weighting blocks 31a-31c, where the number of these blocks is "N", and the amplitude and phase weighting control blocks are connected to antenna elements within a single ring 1, . . . , N, correspondingly. Thus, block 31a controls the amplitude and phase of the central antenna element (i.e. Ring 1), the block 31b controls the amplitude and phase of the innermost ring with eight elements, i.e. the Ring 2, and so on, until the block 31c controls the amplitude and phase of the outermost ring, i.e. Ring 5. The control signal for all the antenna elements within a single ring is the same, thus resulting similar controls within the antenna elements with the same radius from the center of the array.

From the distance D from the antenna array, the device under test DUT, i.e. the receiving antenna array 34 is placed also along a vertical plane as was the case with the antenna array 32. In this example, the RX antenna for the testing is 6*6 matrix-type of antenna array where the antenna elements 35 of the RX antenna 34 locate in regular vertical columns and horizontal rows. In an embodiment, the distance between the antenna array (TX) and the RX antenna can be set to only approximately two meters. The result is that complex far-field measurements do not anymore require so much space, and the test procedure can be performed in interior premises, within a regular laboratory room or test chamber, for instance.

The measured received RX signal from the antenna elements 35 are fed into the base station for further processing and analysis. After that base station can report for example received signal strength or bit error rate values to test system processor 30.

It is notable that there can be positioning means for both antenna array 32 and DUT array 34 but these are not shown in FIG. 3 for simplification purposes. Antenna array 32 can be also rotated when different DUT antenna polarities are measured. There are also other components such as power splitters for splitting the control signal to M antenna elements (here M=8).

As a result, antenna elements in the same ring will be directed with a same amplitude and phase shift but the weightings between each ring will usually be different. Of course, if the optimization results calculate the same weighting value for e.g. rings 2 and 3, that is possible. Also at least one of the rings may be given a control signal equal to zero, meaning that those antenna rings are switched off. It is also possible to add other amplification and filtering elements in either TX or RX branches. Also the mutual distance D between the two antennas can be tunable. In the RX measurement arrangement, the actual input data can be created by a specific VSG block, meaning a vector signal generator (not shown) connected to the test system processor/controller 30. In the TX measurement arrangement, the actual input data can be analysed by a specific VSA block, meaning a vector signal analyzer (not shown) connected to the test system processor/controller 30. Also the actual detection of the combined signals on RX antennas 35 can be performed in a VNA block, meaning a vector network analyzer (not shown) connected to the test system processor/controller 30 or to a separate processor/controller if a passive 4.5G or 5G antenna without base station is measured.

The controlling of the antennas is desired to be performed in groups, meaning that there is no requirement for controlling each antenna element separately. This means that the required number of electrical control and adjustment elements will be decreased. Also the complexity of the antenna array and their controlling signals will decrease, making the system less expensive to build and to maintain.

The main feature of the invention is that if the physical size of the single antenna element is small, then the mutual distance can also be selected to be small, and this in turn leads to the result that more circular rings can be applied within feasible indoor testing environments. Wideband properties are also ensured when using sufficiently lot of antenna rings. As it is in the core of the invented control method, desired antenna circles can be just turned off in order to obtain good general antenna characteristics for the whole array for 4.5G or 5G testing purposes. For picking desired antenna rings as on, and for selecting the rest of the antenna rings as off, corresponding switches connected in each antenna line are used to make the connection.

In an embodiment, ten antenna rings are used in the simulations, numbered from one to ten from the innermost ring to the outermost ring. The diameter of the ten rings bowtie antenna array is in this example 0.75 m. Just for exemplifying the simulations and the selecting processes with the antenna array, the following results are obtained when different antenna ring combinations are selected into use by picking a desired number of rings and the rings themselves. When the frequency of 6 GHz is applied, the best plane wave characteristics can be obtained by selecting seven antenna rings: namely rings no. 2-6 and 9-10. When using the frequency of 3 GHz, the best corresponding result is obtained by selecting eight antenna rings: namely rings no. 1, 3-7 and 9-10. Furthermore, regarding the frequency of 1.7 GHz, only five antenna rings out of ten was sufficient for obtaining an optimal result: namely rings no. 1, 4, 6 and 9-10.

The above simulation example with 6.0 GHz frequency with testing different numbers of antenna rings (from a single ring to all ten rings) is shown in FIG. 4 in a table form. With each number of picked antenna rings, the optimal ring nos. are mentioned in the right-hand side column. The optimal mean amplitude error, the optimal mean phase error, and the quantized mean amplitude error, the quantized mean phase error, and in a similar fashion, the optimal maximum amplitude and phase errors and the quantized maximum amplitude and phase errors are all calculated in the simulations. The best combined values can be found when using seven pieces of antenna rings, namely nos. 2, 3, 4, 5, 6, 9 and 10. Thus, with 6.0 GHz, the antenna elements within these circular rings are switched on, and rings no. 1, 7 and 8 are switched off.

However, it can be seen from the table of FIG. 4 that four rings (nos. 2+7+8+9) achieve almost as good result as the most optimal result with seven rings. Thus, the final finding from the summary above: "Number of the antenna rings can be reduced quite much without significant performance degradation", has simulational support in these results.

The presented design of the antenna array with a star shape is merely an example of the present invention. In addition to the star shape with eight radial parts, also a spiral shape with a desired number of branches, or any antenna arrangement with a symmetry in relation to the central point of the array can be used. Other radial structures resembling the star shape, such as with four radial lines (X-shape) or with sixteen radial lines, are possible. Alternatively, the symmetry can also be defined in view of a certain line splitting the antenna arrangement area in half. Also the invention desires to broaden these strict placement definitions a bit, and thus, also antenna element positions which slightly deviate from the perfect symmetry is allowed. This means that e.g. a circle, an ellipse, a square are possible formations for a single sub-array of antenna elements. This means that each further sub-array away from the center spot will surround the previous sub-arrays, no matter the shape of the single sub-array. In the Figures, this is exemplified by circularly formed sub-arrays.

In other words, the antenna elements are placed in substantially symmetrical fashion in view of a center spot of the antenna arrangement or in view to a central line splitting the antenna arrangement in half. Furthermore, each sub-array may locate in a band-shaped area, where the antenna elements in a single sub-array form a substantially symmetrical arrangement in view to a center spot or to a central line. The band means a circular ring-typed band where the radii of the different subarrays vary so that the rings surround the previous ring in an adjacent fashion. In case of an elliptical form in the sub-arrays, the antenna elements are placed in elliptically shaped bands, with the bands surrounding one another. This may be achieved by relocating the elements of FIG. 1 in either X-direction or in Y-direction. Of course, the number of the antenna elements within a single sub-array can be determined based on the application.

In case of a square-shaped sub-arrays, there can be eight elements forming a band-shaped square arrangement. In this case the radial distances of the elements from the same sub-array in view of the center spot will vary.

In other words, summarizing the different sub-array formulations (comprising circle, ellipse and square shaped bands for the sub-arrays), the sub-arrays locate in bands surrounding one another with a substantially mutual center spot, the antenna elements in a single sub-array forming a substantially symmetrical arrangement in view of a center spot or a center line.

Small deviations are possible to the exactly symmetrical spots of the antenna elements. Also the height dimension of the antenna elements are discussed elsewhere, making deviations to exact symmetry. In the sense of FIG. 1, the height is directed towards the viewer or away from the viewer (the Z-direction in the above context).

Also regarding the height aspect of a single antenna element in relation to the other antenna elements, an antenna element height can be tuned by screwing means. The height thus means the deviation in the orthogonal direction from the planar level of the antenna elements, if all the other antenna elements are situated on a plane. The height of any antenna element can be tuned in this dimension with the help of a screw or screws. Of course, the antenna array can be placed in any desired direction where the word "height" might be misleading. For instance, a common testing arrangement comprises the antenna array basically in a vertical direction where the plane wave will propagate in a horizontal direction. In this kind of an alignment, the height means the horizontal deviation from the vertical antenna plane.

Regarding the selection and switchings of different sub-arrays during using the system (like in FIG. 4), we can summarize the operation as in the following. The test system processor 30 of the system is configured to switch on and control dedicated sub-arrays among the whole antenna arrangement, and to switch the rest of the sub-arrays off, while applying this in a predetermined use frequency. Still, the wideband testing of a 4.5G or 5G base station is enabled by reswitching of the desired sub-arrays on or off in a given time instant during usage of a different frequency. All this is performed without physically moving any of the antenna elements from their height-tuned position.

The type of the antenna elements can be selected from various possible antenna design types. These antenna types include a bowtie dipole antenna, a regular dipole antenna, patch antenna, yagi antenna, a Vivaldi antenna (i.e. a tapered slot antenna), and a broadband monopole.

The number of required circular rings of antenna elements depends on the used frequency and DUT size. The higher the used frequency, the more circular antenna rings is required.

In an embodiment, each sub-array locates in a substantially ring-shaped area with a predetermined radius around the center spot.

In an embodiment, a sub-array is a band of area with a square shape.

In an embodiment, a sub-array is a band of area with an elliptical shape.

An important feature of the invention is that all antenna elements are configured to remain mechanically stationary during usage of the arrangement in wideband 4.5G or 5G base station testing after the height tunings have been made for the antenna elements.

At least one screw can act as the height tuning means between the respective antenna element and the printed circuit board.

In an embodiment of the invention, in order to cancel or at least minimize detrimental reflections between the device under test and the PWG panel, there can be used absorber material in the empty spaces between the antenna elements. The absorber material is selected among materials which have efficient characteristics in absorbing RF signals. The absorber material may be sized so in different pieces that it fills the antenna element gaps either fully or partially. Such embodiment using absorber material is harder to implement in the prior art case of physically movable antenna elements; thus, the stationary nature of the antenna elements allows the use of absorbing material efficiently which is a further advantage of such an embodiment. The RF absorber material can be fixed on the printed circuit board as dedicated rectangular pieces between the antenna elements, or the antenna elements can be placed to holes carved in the already assembled absorber material mat on the printed circuit board.

There are significant advantages with the antenna array structure according to the present invention. Mechanical movements of separate antennas are fully unneeded in the invention. Furthermore, there is no need to build specific and separate antenna matrices for each applied frequency, which simplifies the concept and reduces the number of used electrical and antenna elements significantly. The lack of motors and the lack of the need for mechanical movements mean that there is no need to use expensive, or easily wearing parts which would require lots of maintenance. Therefore, present system is less prone to wear and tear and thus, saves costs. Furthermore, there is no need to insert individual RF cable to each antenna element, and this is a beneficial reduction in the needed hardware because the RF cables would also move, wear or transform due to moving, bending and stretching of the cables due to the moving antenna elements of the prior art. The present invention also allows to place the antenna elements as integrated elements onto a single electric circuit plate or onto an otherwise uniform circuit structure, or onto a mechanical element. When acting on a single piece of mechanics or circuit board, the manufacturing tolerances become lower (i.e. the accuracy of the elements' placements gets higher), and general manufacturing costs will be lower. A further advantage is that an electrical adjustment of the antenna groups is quicker than mechanical adjustments of the antenna placements within the desired antenna groups. This makes the whole tuning and possible changes in the operation of the antenna array much quicker.

The present invention is not restricted to the embodiments presented above but it may vary within the scope of the claims.

The invention claimed is:

1. An arrangement applicable to 4.5G or 5G base station testing, wherein the arrangement comprises:
   an antenna arrangement comprising a plurality of antenna elements in a planar arrangement or close to a planar arrangement where a height of an antenna element can be individually tuned in view of other antenna elements,
   a test system processor controlling the amplitude and phase of the plurality of antenna elements, and
   the plurality of antenna elements are placed in substantially symmetrical fashion in view of a center spot of the antenna arrangement or in view to a center line splitting the antenna arrangement in half,
wherein
   the test system processor is configured to divide the plurality of the antenna elements into sub-arrays, where the sub-arrays locate in bands surrounding one another with a substantially mutual center spot, the antenna elements in a single sub-array forming a substantially symmetrical arrangement in view of the center spot or the center line, wherein
   the test system processor is configured to control all the antenna elements in the same sub-array with a predetermined amplitude and phase, and
   the test system processor is configured to switch on and control dedicated sub-arrays among the whole antenna arrangement, and to switch the rest of the sub-arrays off, applied in a predetermined use frequency, enabling reswitching of the sub-arrays on or off in a given time instant during wideband testing of a 4.5G or 5G base station.

2. The arrangement according to claim 1, wherein the antenna arrangement is configured to be formed in a star-shaped arrangement, comprising direct radial branches of the antenna elements.

3. The arrangement according to claim 2, wherein the antenna arrangement comprises eight, four or sixteen radial branches of the antenna elements in view of the center spot of the antenna arrangement.

4. The arrangement according to claim 1, wherein the antenna elements are all of a same antenna type.

5. The arrangement according to claim 4, wherein the antenna type is a bowtie dipole with its length less than 10 cm.

6. The arrangement according to claim 4, wherein the antenna type is selected from a group of a regular dipole antenna, patch antenna, yagi antenna, a Vivaldi antenna, and a broadband monopole.

7. The arrangement according to claim 1, wherein each sub-array locates in a substantially ring-shaped area with a predetermined radius around the center spot.

8. The arrangement according to claim 1, wherein a sub-array is a band of area with a square shape.

9. The arrangement according to claim 1, wherein a sub-array is a band of area with an elliptical shape.

10. The arrangement according to claim 1, wherein the whole antenna arrangement is integrated on a single printed circuit board, with height tuning means for the desired antenna elements.

11. The arrangement according to claim 10, wherein amplitude and phase adjustment elements for each antenna ring and their antenna elements are fixed and integrated on the same printed circuit board as the whole antenna arrangement.

12. The arrangement according to claim 1, wherein the arrangement comprises RF absorbing material in gaps between the antenna elements either fully or partially.

13. The arrangement according to claim 1, wherein all antenna elements are configured to remain mechanically stationary during usage of the arrangement in wideband 4.5G or 5G base station testing after the height tunings have been made for the antenna elements.

14. The arrangement according to claim 10, wherein phase tolerances of an input network and manufacturing tolerances of the antenna elements are configured to be compensated by tuning the heights of desired antenna elements in relation to the plane of the antenna arrangement or in relation to heights of the other antenna elements with at least one screw as the height tuning means between the respective antenna element and the printed circuit board during the assembly of the antenna arrangement.

15. A method applicable to 4.5G or 5G base station testing, wherein the method comprises the steps of:
arranging planarly or close to a planar arrangement a plurality of antenna elements into an antenna arrangement where a height of an antenna element can be individually tuned in view of other antenna elements,
controlling the amplitude and phase of the plurality of antenna elements by a test system processor, and
placing the plurality of antenna elements in substantially symmetrical fashion in view of a center spot of the antenna arrangement or in view to a center line splitting the antenna arrangement in half,
wherein the method further comprises the steps of
dividing, by the test system processor, the plurality of the antenna elements into sub-arrays, where the sub-arrays locate in bands surrounding one another with a substantially mutual center spot, the antenna elements in a single sub-array forming a substantially symmetrical arrangement in view of the center spot or the center line, wherein
controlling, by the test system processor, all the antenna elements in the same sub-array with a predetermined amplitude and phase, and
switching on and controlling, by the test system processor, dedicated sub-arrays among the whole antenna arrangement, and switching the rest of the sub-arrays off, applied in a predetermined use frequency, enabling reswitching of the sub-arrays on or off in a given time instant during wideband testing of a 4.5G or 5G base station.

\* \* \* \* \*